United States Patent
Kim et al.

[11] Patent Number: 5,981,341
[45] Date of Patent: Nov. 9, 1999

[54] SIDEWALL SPACER FOR PROTECTING TUNNEL OXIDE DURING ISOLATION TRENCH FORMATION IN SELF-ALIGNED FLASH MEMORY CORE

[75] Inventors: Unsoon Kim, Santa Clara; Yowjuang W. Liu, San Jose; Yu Sun, Saratoga; Angela T. Hui, Milpitas, all of Calif.

[73] Assignee: Advanced Micro Devices, Sunnyvale, Calif.

[21] Appl. No.: 08/986,160

[22] Filed: Dec. 5, 1997

[51] Int. Cl.$^6$ .................................................. H01L 21/336
[52] U.S. Cl. ..................... 438/264; 438/257; 438/229; 438/304; 438/367
[58] Field of Search ................................ 438/257, 264, 438/229, 304, 366, 367, 302, 183, 184, 221, 248

[56] References Cited

U.S. PATENT DOCUMENTS

| | | | |
|---|---|---|---|
| 5,024,957 | 6/1991 | Harame et al. | 438/367 |
| 5,278,438 | 1/1994 | Kim et al. | 438/257 |
| 5,391,508 | 2/1995 | Matsuoka et al. | 438/302 |
| 5,409,854 | 4/1995 | Bergemont | 438/264 |
| 5,420,060 | 5/1995 | Gill et al. | 438/264 |
| 5,427,968 | 6/1995 | Hong | 438/264 |
| 5,474,947 | 12/1995 | Chang et al. | 438/257 |
| 5,478,767 | 12/1995 | Hong | 438/304 |
| 5,494,838 | 2/1996 | Chang et al. | 438/264 |
| 5,631,179 | 5/1997 | Sung et al. | 438/264 |
| 5,661,057 | 8/1997 | Fujiwara | 438/257 |
| 5,702,965 | 12/1997 | Kim | 438/264 |

OTHER PUBLICATIONS

A 0.67 um2 Self–Aligned Shallow Trench Isolation Cell (SA–STI Cell) For 3V–only 256Mbit NAND EEPROMS, pp. 3.6.1–3.6.4, International Electronic Devices Meeting, Sponsored by IEEE, 1994.

*Primary Examiner*—Carl Whitehead, Jr.
*Assistant Examiner*—Khanh Duong
*Attorney, Agent, or Firm*—LaRiviere, Grubman & Payne LLP

[57] ABSTRACT

A method for making a self-aligned isolated flash memory core without damaging tunnel oxide layers between memory element stacks and the silicon substrate supporting the stacks includes depositing three sidewall layers on the stacks, prior to etching isolation trenches between the stacks, to thereby shield the tunnel oxide during isolation trench etching.

11 Claims, 4 Drawing Sheets

SIDEWALL SPACER FOR PROTECTING TUNNEL OXIDE DURING ISOLATION TRENCH FORMATION IN SELF-ALIGNED FLASH MEMORY CORE

TECHNICAL FIELD

The present invention relates generally to computer flash memory systems, and more particularly to systems and methods for isolating flash memory elements.

BACKGROUND OF THE INVENTION

Computer flash memory chips are used in many applications, including hand held computing devices, wireless telephones, and digital cameras. In computer flash memory, a flash memory core containing a matrix of memory elements is surrounded by a periphery containing peripheral elements. The elements in the core assume physical states which represent bits of data. Consequently, by configuring the core elements appropriately, data (such as preselected telephone numbers in a wireless telephone or digital images in a digital camera) may be stored in the core and subsequently read by detecting the physical state of one or more core elements. Flash memory chips fall into two main categories, namely, those having a so-called "NOR" architecture and those having a so-called "NAND" architecture. Of importance to the present invention is flash memory chips having NOR architectures, although the present invention applies to NAND architectures as well.

To enable the individual memory elements of a flash memory chip to maintain the physical state with which they have been programmed, each memory region must be isolated from its neighboring regions. In the case of the peripheral regions, isolation is achieved by a method referred to in the art as local oxidation silicon, or "LOCOS". LOCOS isolation requires disposing an inactive silicon oxide insulator between neighboring active regions. While acceptable for isolating peripheral regions, however, LOCOS isolation is less than desirable for memory core cell isolation. This is because it is desirable to minimize the distance between core cells to increase memory density, and the silicon in LOCOS isolation tends to encroach on the core memory cells, thereby decreasing core cell (and, hence, memory) density.

Accordingly, a process that renders closely spaced memory core cells, referred to in the art as "self-aligned" cells, has been developed. Self-aligned memory core cells are isolated from each other by shallow trenches that are etched into the silicon substrate of the core, between adjacent memory cells. The memory cells between the trenches are established by one or more layers of polysilicon material, with the layers being aligned with each other and not overlapping the trenches.

Just on top of the silicon substrate a very thin tunnel oxide layer is grown. This tunnel oxide layer is essential to the proper functioning of the flash memory chip. Accordingly, it is desirable not to damage the tunnel oxide layer during trench etching, because such damage can reduce the endurance characteristics of the flash memory chip. Unfortunately, during trench etching it can happen that the portions of the tunnel oxide layer next to the trench being formed are damaged or otherwise degraded. As mentioned above, such damage to the tunnel oxide layer diminishes the lifecycle of the chip. As recognized herein, however, it is possible to protect the edges of the tunnel oxide layer in a flash memory core during isolation trench etching, thereby promoting the usefulness and/or endurance of the flash memory.

Accordingly, it is an object of the present invention to provide a method and system for isolating core memory cells of a computer flash memory device. Another object of the present invention is to provide a method and system for isolating core memory cells of a flash memory device which does not degrade the tunnel oxide layer during etching. Still another object of the present invention is to provide a method and system for isolating core memory cells of a flash memory device by establishing isolation trenches between the cells such that the tunnel oxide layer of the memory core of the device is protected during etching. Yet another object of the present invention is to provide a method and system for isolating core memory elements of a flash memory device that is easy to use and cost effective.

BRIEF SUMMARY OF THE INVENTION

A process is disclosed for making a flash memory core. The process includes the steps of providing at least one silicon substrate and establishing plural stacks on the substrate. Each stack includes a tunnel oxide layer facing the substrate. At least three sidewall layers are established on at least some of the stacks. More specifically, in the preferred embodiment at least one oxide sidewall layer is established on at least some of the stacks and at least one nitride sidewall layer is established over at least a portion of the oxide sidewall layer. The nitride sidewall layers are anisotropically etched, and then a polysilicon sidewall layer is deposited on at least a portion of the nitride sidewall layer.

Next, the process envisions forming isolation trenches between at least two stacks that have sidewall layers, with the sidewall layers protecting the tunnel oxide layers of the respective stacks during the forming step. Preferably, an insulative material is disposed in at least some of the trenches.

In one preferred embodiment, the step of establishing the stacks is accomplished at least in part by dry etching. The present flash memory is a self-aligned isolated memory; consequently, each stack includes a polysilicon layer on the tunnel oxide layer, a high temperature oxide layer on the polysilicon layer, and a nitride layer on the high temperature oxide layer. A flash memory wafer made according to the present method, as well as a computing device incorporating the flash memory wafer, are also disclosed.

In another aspect, a flash memory wafer includes a core memory region including at least one silicon substrate, and plural stacks in the core memory region. As disclosed in detail below, each stack has at least one respective sidewall layer for protecting at least a portion of a respective tunnel oxide layer between the stack and the substrate.

In yet another aspect, a method for making a flash memory wafer includes the step of establishing plural stacks on at least one silicon substrate. A respective tunnel oxide layer is disposed between each stack and the substrate, and at least portions of the tunnel oxide layers that would otherwise be exposed are shielded. Then, isolation trenches are formed between adjacent stacks such that the tunnel oxide layers are protected from degradation.

Other features of the present invention are disclosed or apparent in the section entitled: "DETAILED DESCRIPTION OF THE INVENTION."

BRIEF DESCRIPTION OF DRAWINGS

For fuller understanding of the present invention, reference is made to the accompanying drawing in the following detailed description of the Best Mode of Carrying Out the Present Invention. In the drawings.

Figure 1:
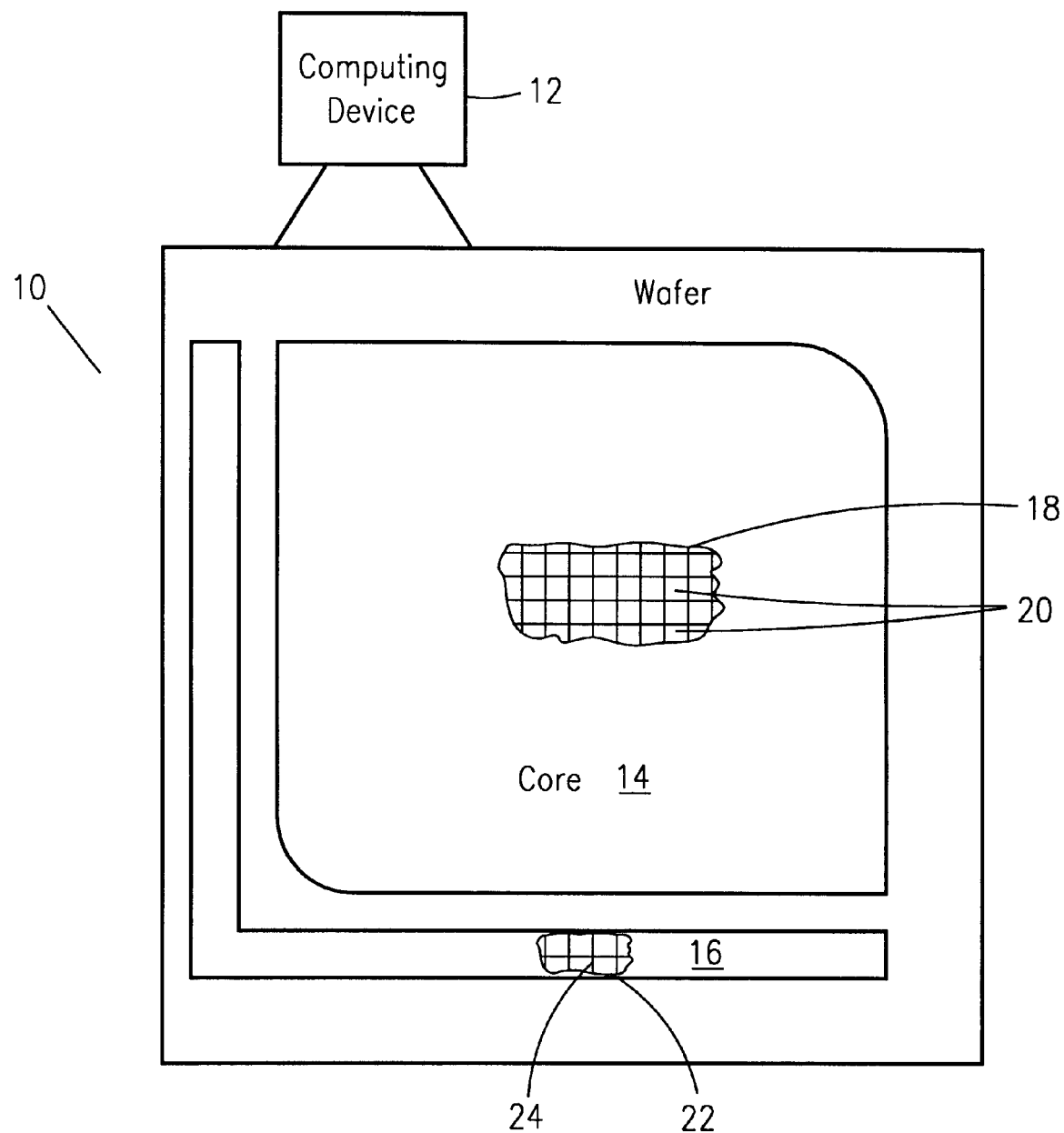
FIG. 1 is a schematic plan view of the present flash memory wafer in an exploded relationship with a computing device, with portions schematically cut away to show the memory elements.

Reference numbers refer to the same or equivalent parts of the present invention throughout the several figures of the drawing. In the description, the terms "vertical" and "horizontal" refer to the orientations of the figures shown, for purposes of disclosure, and do not necessarily refer to the orientation of the present wafer once the wafer is embodied in a computing device.

DETAILED DESCRIPTION OF THE INVENTION

Referring initially to FIG. 1, a flash memory wafer is shown, generally designated 10. The flash memory wafer 10 can establish any flash memory chip for use in the computer arts. In one preferred embodiment, the flash memory wafer can be an electrically programmable memory (EPROM). As shown in FIG. 1, the wafer 10 can be incorporated into a computing device 12, e.g., a digital camera, wireless telephone, or hand held computer, for use by the computing device 12.

FIG. 1 shows that the wafer 10 includes a core memory array 14 and a periphery region 16 bounding at least a portion of the core memory array 14. As can be appreciated in reference to FIG. 1, the core memory array 14 includes a grid or matrix 18 of core memory elements 20, each of which must be isolated from its neighbors. Similarly, the periphery region 16 includes a grid or matrix 22 of peripheral memory elements 24, each of which must be isolated from its neighbors. In accordance with the present invention, the peripheral memory elements 24 can be isolated from each other using the above-mentioned LOCOS method. On the other hand, to facilitate improved fabrication and closer spacing of core memory elements 20 (and, hence, higher memory capacity of the wafer 10), the core memory elements 20 are isolated from each other using the novel trench etching process disclosed herein.

Figure 2:
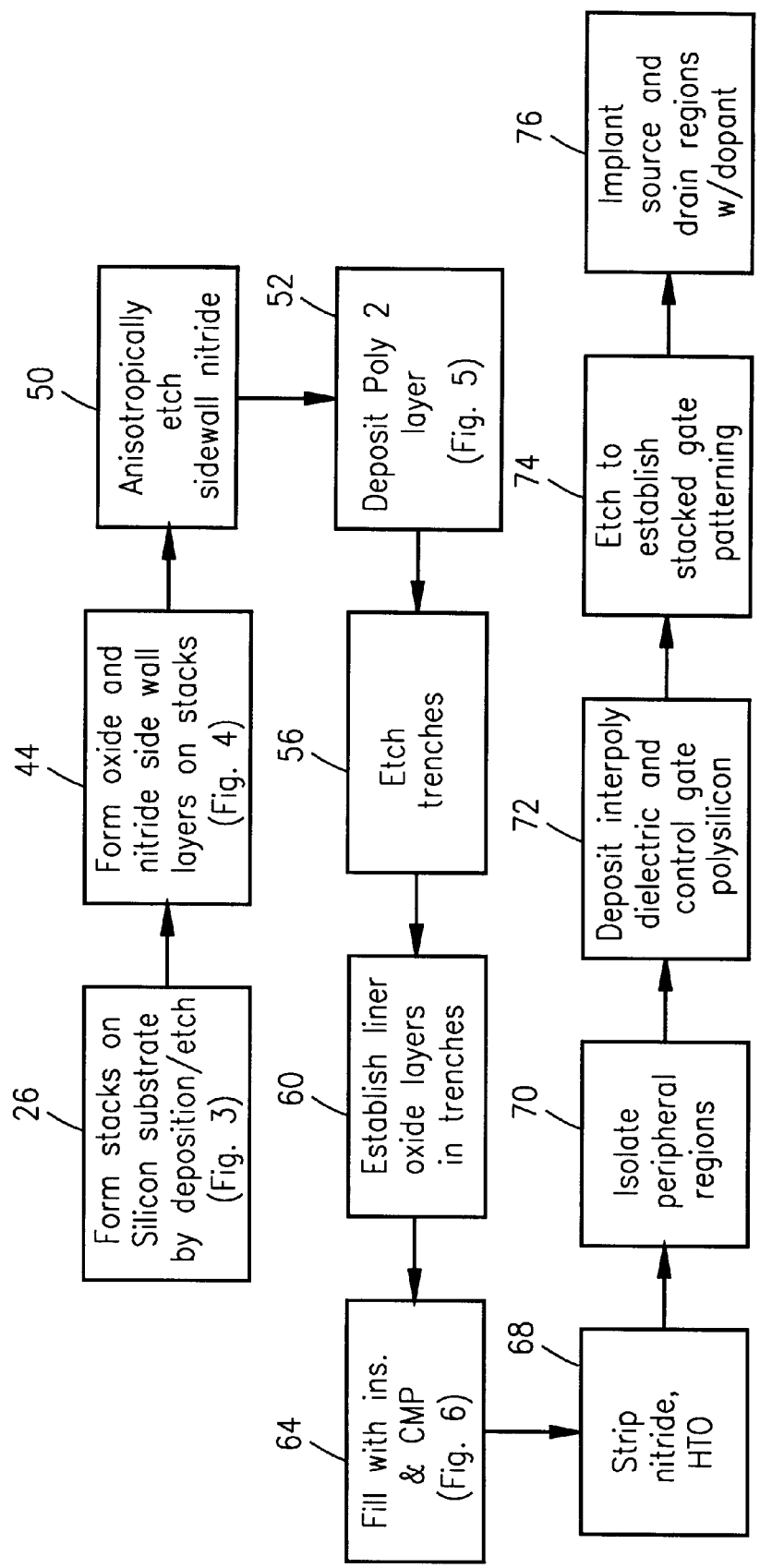
FIG. 2 is a flow chart of the present process.

FIG. 2 shows the novel trench etching process of the present invention. Commencing at block 26, memory element stacks are established on a silicon substrate. More particularly, a tunnel oxide layer is disposed on the silicon substrate (e.g., by growing the tunnel oxide layer), a polysilicon layer is disposed on the tunnel oxide layer, a high temperature oxide layer is disposed on the polysilicon layer, and a nitride layer (such as silicon nitride, $Si_3N_4$) is disposed on the high temperature oxide layer. Then, a suitable photoresist layer is disposed on the nitride layer and exposed to ultraviolet light to establish a predetermined pattern in the photoresist layer, with the predetermined pattern being the desired isolation trench pattern of the wafer 10. The stacks are then established by etching through the various layers to the tunnel oxide layer on the silicon substrate.

Figure 3:
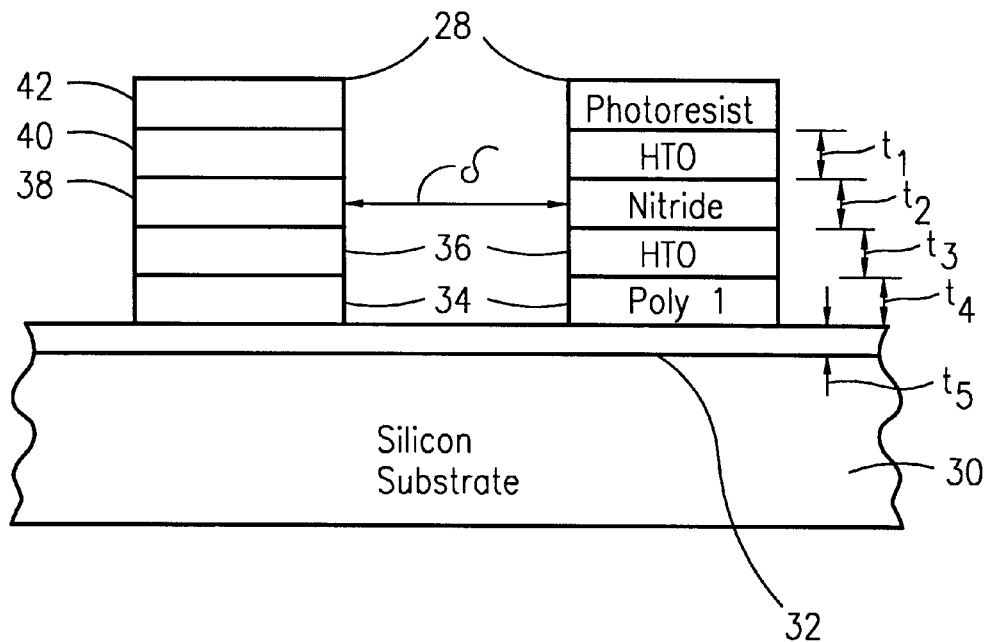
FIG. 3 is a schematic elevational view of a portion of the memory core from the bit line direction, after the stacks have been established on the silicon substrate and before removal of the photoresist mask layer.

The results of the above step are shown in FIG. 3. As shown, plural stacks 28, which in all essential respects are identical to each other in configuration, are disposed on a silicon substrate 30, with the distance δ between stacks (after etching) being about four tenths of a micron (0.4µ). Per the present invention, the core memory of the present invention is a self-aligned isolated memory.

With this in mind, each stack 28 that is established after etching includes a respective tunnel oxide layer 32 having a thickness "$t_5$" of about fifty Angstroms to two hundred Angstroms (50 Å–200 Å), with the tunnel oxide layers 32 being integrally formed with each other on the silicon substrate 30 by growing the layers 32 in accordance with principles known in the art. Also, each stack 28 includes a polysilicon "1" layer 34 on the tunnel oxide layer 32. The polysilicon "1" layers 34 have thicknesses "$t_4$" equal to about six hundred Angstroms to one thousand Angstroms (600 Å–1000 Å).

Moreover, each stack 28 includes a first high temperature oxide (HTO) layer 36 on the respective polysilicon "1" layer 34, with the first HTO layers 36 having thicknesses "$t_3$" equal to about one hundred Angstroms to two hundred Angstroms (100 Å–200 Å). The first HTO layers 36 can be CVD oxide layers. Additionally, each stack 28 includes a respective nitride layer 38 on the respective first HTO layer 36. The nitride layers 38 can be silicon nitride ($Si_3N_4$) layers having thicknesses "$t_2$" about equal to twelve hundred Angstroms to seventeen hundred Angstroms (1200 Å–1700 Å).

FIG. 3 also shows that on top of each nitride layer 38 is a respective second HTO layer 40 having a thickness "$t_1$" equal to about one hundred Angstroms to two hundred Angstroms (100 Å–200 Å), and a photoresist mask layer 42 is disposed on the second HTO layers 40. In accordance with self-aligned isolated memory fabrication principles, the photoresist layer 42 is exposed to ultraviolet light to establish a pattern in the photoresist layer as appropriate for establishing a predetermined trench pattern in the silicon substrate 30. In other words, the photoresist layer 42 is exposed to light such that each stack 28 is protected by a respective portion of the photoresist layer 42, whereas the area above each intended isolation trench is not protected by the photoresist layer.

Next, a dry etching process is used to remove those portions of the oxide, nitride, and polysilicon layers that are directly beneath the trench pattern made in the photoresist layer. This dry etch process can be a plasma etch process in accordance with dry etch procedures known in the art. FIG. 3 shows the wafer 10 after the above-described dry etch process, and after the remaining portions of the photoresist layer 42 have been removed subsequent to the dry etch.

Figure 4:
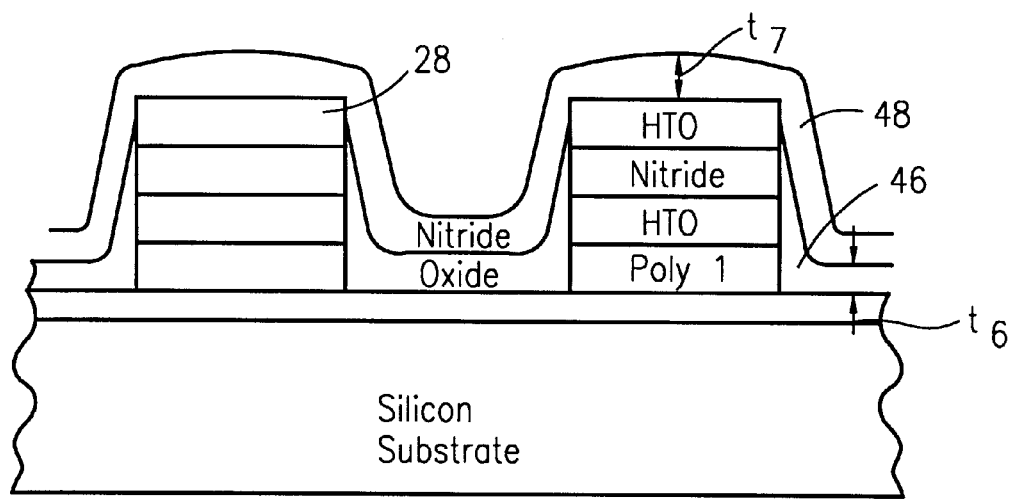
FIG. 4 is a schematic elevational view of a portion of the memory core from the bit line direction, after the nitride and oxide sidewall layers have been deposited on the stacks.

Once the self-aligned stacks 28 of the present wafer 10 have been established at block 26, the process moves to block 44, wherein an oxide sidewall layer 46 (FIG. 4) is formed on the sides of each stack 28, and a nitride sidewall layer 48 is deposited over the stacks 28 and oxide sidewall layers 46. In the preferred embodiment, the oxide sidewall layer 46 has a thickness "$t_6$" of about one hundred Angstroms to seven hundred Angstroms (100 Å–700 Å), and the nitride sidewall layer 48 has a thickness "t₇" of about five hundred Angstroms to one thousand Angstroms (500 Å–1000 Å).

Figure 5:
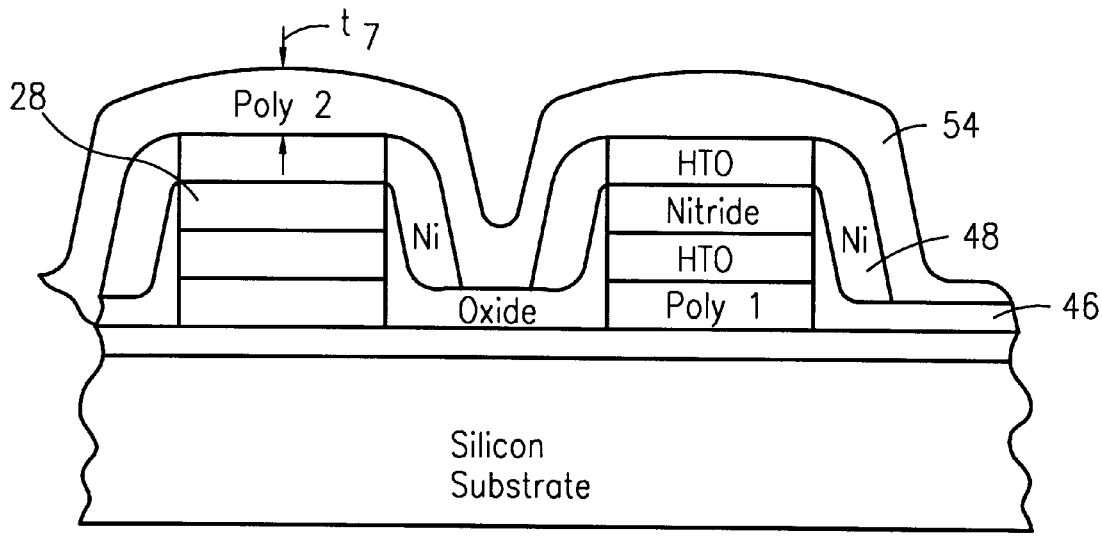
FIG. 5 is a schematic elevational view of a portion of the memory core from the bit line direction, after the nitride sidewall layers have been anisotropically etched and the polysilicon sidewall layer has been deposited on the stacks.

Moving to block 50 of FIG. 2 and referring to FIG. 5, the nitride sidewall layer 48 is etched by anisotropic etching to cover only the sides of the stacks 28 as shown in FIG. 5. Accordingly, no mask is required for the etching process of block 50.

As indicated at block 52 and as shown in FIG. 5, after the nitride sidewall layer 48 has been anisotropically etched, a polysilicon "2" layer 54 is deposited onto the wafer 10. Preferably, the thickness "t₇" of the polysilicon "2" layer 54 is about five hundred Angstroms to one thousand Angstroms (500 Å–1000 Å).

Figure 6:
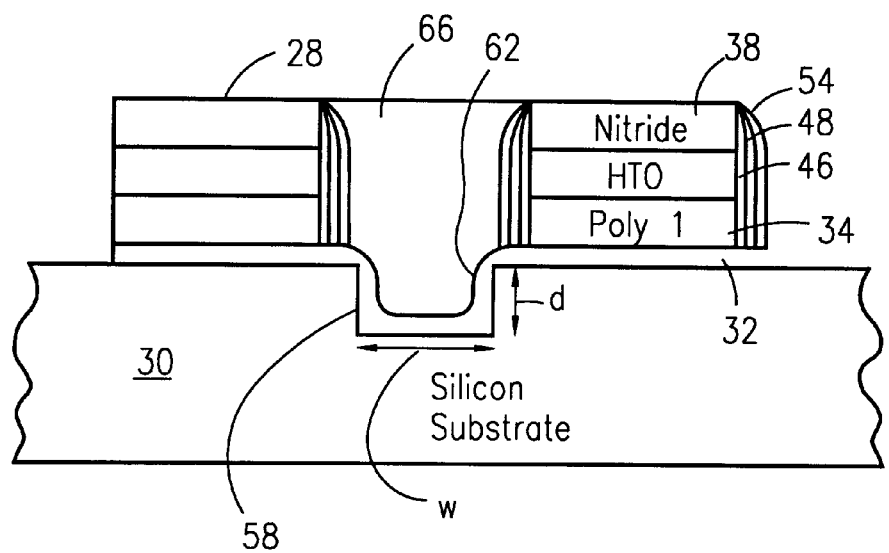
FIG. 6 is a schematic elevational view of a portion of the memory core from the bit line direction, after isolation trench etching and after TEOS insulation has been deposited in the trenches and the TEOS and stacks have been polished down to the nitride layers of the stacks.

Proceeding to block 56 and considering FIG. 6, isolation trenches 58 are etched into the silicon substrate 30 by using a dry etching process. Only the portions of the polysilicon "2" layer 54 that are adjacent the nitride sidewall layers 48 remain after etching, thus establishing a third protective sidewall layer.

The stacks 28 are not etched because each stack 28 is protected by its respective second HTO layer 40 (FIG. 3). Moreover, as can be appreciated in reference to FIG. 6, the sides of each stack 28 are protected by the sidewall layers 46, 48, 54, thereby shielding the edges of the tunnel oxide layer 32 that is between each stack 28 and the silicon substrate 30 from degradation during etching.

As also shown in FIG. 6, each trench 58 that is between adjacent stacks 28 does not extend completely to the polysilicon "1" layer 34 of each stack, but rather extends only partially between the stacks 28, owing to the sidewall layers 46, 48, 54. The depth "d" of each isolation trench 58 is about two tenths of a micron to three tenths of a micron (0.2μ–0.3μ), and the width "w" of each trench 58 is less than the distance δ between elements. For example, the width "w" of each trench 58 can be about two tenths of a micron (0.2μ).

After trench etching, the process moves to block 60, wherein a liner oxide layer 62 (FIG. 6) is established in each trench in accordance with principles known in the art. Then, at block 64, the trenches 58 and spaces between the stacks 28 are filled with an insulative material 66 such as CVO oxide. The CVO oxide is next polished down and the second HTO layers 40 removed using chemical mechanical polishing (CMP) to establish the configuration shown in FIG. 6.

Fabrication is completed at blocks 68–76. Specifically, at block 68 the nitride layers 38 and first HTO layers 36 are stripped, and at block 70 the peripheral elements 24 are isolated in accordance with peripheral element isolation principles known in the art. Then, at block 72 an interpoly dielectric layer such as oxidenitride-oxide (ONO) is deposited onto the polysilicon "1" layers 34, followed by depositing a layer of control polysilicon on the interpoly dielectric. Next, at block 74 the stacked gate patterning is established using the above-described etching principles. If desired, the step of patterning the floating gates at block 74 can be undertaken using the same mask as used at block 56 to pattern the isolation trenches. Then, at block 76 the source and drain regions of the memory core 14 are implanted with dopant. Thus, according to the present invention source and drain region doping are undertaken only after the control gates of the core memory cells have been established.

The present invention has been particularly shown and described with respect to certain preferred embodiments and features thereof. However, it should be readily apparent to those of ordinary skill in the art that various changes and modifications in form and detail may be made without departing from the spirit and scope of the inventions as set forth in the appended claims, in which reference to an element in the singular is not intended to mean "one and only one" unless explicitly so stated, but rather "one or more". The inventions illustratively disclosed herein may be practiced without any element which is not specifically disclosed herein.

What is claimed is:

1. A process for isolating core memory elements in a core memory array portion of a flash memory having both core memory elements and peripheral memory elements, said process comprising the steps of:

providing at least one silicon substrate, the silicon substrate establishing a flash memory substrate;

establishing plural stacks on the silicon substrate, each stack comprising a plurality of layer members, including a tunnel oxide layer facing the substrate and a first polysilicon layer disposed on the tunnel oxide layer, said plural stacks being formed with said plurality of layer members for subsequently forming self-aligned core memory elements;

establishing at least three sidewall layers on at least some of the stacks;

forming isolation trenches between at least two stacks having sidewall layers, the sidewall layers protecting the tunnel oxide layers of the respective stacks during the forming isolation trenches step;

establishing a liner oxide layer in each isolation trench;

disposing an insulative material in at least some of the trenches;

polishing the insulative material and removing at least three layer members of the plural stacks established on the silicon substrate, said removing step not including removal of said tunnel oxide layer and said first polysilicon layer;

fabricating core memory elements by establishing an interpoly dielectric layer on said first polysilicon layer;

establishing a layer of control polysilicon on the interpoly dielectric layer;

establishing a stacked gate pattern by patterning said control polysilicon layer and said interpoly dielectric layer on said first polysilicon layer; and dopant implanting the source and drain regions of the flash memory core elements.

2. The method of claim 1:

wherein the isolation trenches are formed by etching;

wherein said step of establishing plural stacks comprises establishing a first oxide layer member, a second oxide layer member and a nitride layer member;

wherein said step of removing at least three layer members of the plural stacks comprises removing said previously established first and second oxide layer members and the nitride layer; and wherein said interpoly dielectric layer comprises oxide-nitride-oxide material commonly referred to as ONO.

3. The method of claim 1:

wherein the establishing plural stacks step is accomplished at least in part by dry etching, and wherein each stack comprises said first polysilicon layer on the tunnel oxide layer, a first oxide layer on the first polysilicon layer, and a nitride layer on the first oxide layer, and a second oxide layer on said nitride layer;

wherein said step of removing at least three layer members of the plural stacks comprises removing the first and second oxide layer members and the nitride layer member; and wherein said interpoly dielectric layer comprises oxide-nitride-oxide material commonly referred to as ONO.

4. The method of claim 3, wherein the establishing at least three sidewall layers step includes establishing at least one oxide sidewall layer on at least some of the stacks and establishing at least one nitride sidewall layer over at least a portion of the oxide sidewall layer.

5. The method of claim 4, further comprising the step of anisotropically etching the nitride sidewall layer.

6. The method of claim 5, wherein the establishing at least three sidewall layers step further includes establishing at least one polysilicon sidewall layer on at least a portion of the nitride sidewall layer.

7. A method for making a flash memory wafer having a core memory array region including core memory elements, and a periphery region including peripheral memory elements, said method comprising the steps of:

establishing plural stacks on at least one silicon substrate, said plural stacks comprising a plurality of layer members including a respective tunnel oxide layer being disposed between each stack and the silicon substrate and a first polysilicon layer disposed on the tunnel oxide layer, said plural stacks being formed with said plurality of layer members for subsequently forming self-aligned core memory elements;

in said core memory array region only, shielding at least portions of the tunnel oxide layers that would otherwise be exposed;

forming isolation trenches between adjacent stacks such that the tunnel oxide layers are protected from degradation as a result of the shielding at least portions of the tunnel oxide layer step;

establishing a liner oxide layer in each isolation trench;

disposing an insulative material in at least some of the trenches;

polishing the insulative material and removing at least three layer members of the plural stacks established on the silicon substrate, said removing step not including removal of said tunnel oxide layer and said first polysilicon layer;

in said periphery region, isolating peripheral memory regions of said wafer;

establishing an interpoly dielectric layer on said first polysilicon layer;

establishing a layer of control polysilicon on the interpoly dielectric layer;

establishing a stacked gate pattern by patterning said control polysilicon layer and said interpoly dielectric layer on said first polysilicon layer; and dopant implanting the source and drain regions of the flash memory's core memory cells.

8. The method of claim 7: wherein the establishing plural stacks step is accomplished at least in part by dry etching, and wherein each stack includes said first polysilicon layer on the tunnel oxide layer, a first oxide layer on the polysilicon layer, a nitride layer on the first oxide layer, and a second oxide layer on the nitride layer;

wherein said step of removing at least three layer members of the plural stacks comprises removing the previously established first and second oxide layer members and the nitride layer member; and wherein said interpoly dielectric layer comprises oxide-nitride-oxide material commonly referred to as ONO.

9. The method of claim 7:

wherein the shielding at least portions of the tunnel oxide layers step includes establishing at least one oxide sidewall layer on at least some of the stacks and establishing at least one nitride sidewall layer over at least a portion of the oxide sidewall layer;

wherein the establishing plural stacks step is accomplished at least in part by dry etching, wherein each stack includes said first polysilicon layer on the tunnel oxide layer, a first oxide layer on the polysilicon layer, a nitride layer on the first oxide layer, and a second oxide layer on the nitride layer;

wherein said step of removing at least three layer members of the plural stack members step comprises removing the previously established first and second oxide layer members and the nitride layer member; and wherein said interpoly dielectric layer comprises oxide-nitride-oxide material commonly referred to as (ONO).

10. The method of claim 9, further comprising the step of anisotropically etching the nitride sidewall layer.

11. The method of claim 10, wherein the shielding at least portions of the tunnel oxide layers step further includes establishing at least one polysilicon sidewall layer on at least a portion of the nitride sidewall layer.

* * * * *